United States Patent [19]
Yoshimura

[11] Patent Number: 5,198,686
[45] Date of Patent: Mar. 30, 1993

[54] DOUBLE HETERO-TYPE SEMICONDUCTOR LASER DEVICE

[75] Inventor: Kimitaka Yoshimura, Yokohama, Japan

[73] Assignee: Kabushiki Kaisha Toshiba, Kawasaki, Japan

[21] Appl. No.: 791,172

[22] Filed: Nov. 13, 1991

[30] Foreign Application Priority Data

Nov. 13, 1990 [JP] Japan ................... 2-306454

[51] Int. Cl.$^5$ ........................... H01L 33/00
[52] U.S. Cl. ........................... 257/94; 257/13; 257/96; 372/45; 372/46
[58] Field of Search ............ 357/16, 17; 372/44, 372/45, 46

[56] References Cited

U.S. PATENT DOCUMENTS

| | | | |
|---|---|---|---|
| 4,488,306 | 12/1984 | Sugino et al. | 372/46 |
| 4,628,514 | 12/1986 | Dorn et al. | 372/46 |
| 4,841,532 | 6/1989 | Kumabe et al. | 372/46 |
| 4,852,111 | 7/1989 | Hayakawa et al. | 372/46 |
| 4,949,349 | 8/1990 | Ohba et al. | 372/46 |
| 5,023,880 | 6/1991 | Suzuki et al. | 372/46 |
| 5,042,043 | 8/1991 | Hatano et al. | 372/46 |

FOREIGN PATENT DOCUMENTS

| | | | |
|---|---|---|---|
| 56-87390 | 7/1981 | Japan | 372/46 |
| 59-88877 | 5/1984 | Japan | 357/17 |
| 60-34088 | 2/1985 | Japan | 372/46 |
| 2-231783 | 9/1990 | Japan | 372/45 |

*Primary Examiner*—Rolf Hille
*Assistant Examiner*—Minhloan Tran
*Attorney, Agent, or Firm*—Foley & Lardner

[57] ABSTRACT

A semiconductor laser device having: a substrate of a first conductivity type; a first clad layer of the first conductivity type formed on the substrate; an active layer formed on the first clad, the active layer being of either one of the first conductivity type and a second conductivity type opposite to the first conductivity type; a second clad layer of the second conductivity type formed on the active layer; a current block layer of the first conductivity type formed on the second clad layer; and an ohmic layer of the second conductivity type formed on the current block layer, wherein the end portion of the ohmic layer covers the side face of the second clad layer at least to some depth, at a pair of side faces of the semiconductor laser device of a double hetero type having a crystal cleavage face at least at a pair of faces substantially perpendicular to the faces of the substrate.

2 Claims, 4 Drawing Sheets

DOUBLE HETERO-TYPE SEMICONDUCTOR LASER DEVICE

BACKGROUND OF THE INVENTION

The present invention relates to a semiconductor laser device and a method of manufacturing the same.

A perspective view of a conventional semiconductor laser device is shown in FIG. 5. An n-type GaAs substrate 1 is formed on a n side electrode 10 made of an AuGe/Au alloy. Sequentially formed in order on the surface of the n-type GaAs substrate 1 are formed an n-type InGaAlP clad layer 2, InGaP active layer 3, p-type InGaAlP clad layer 4, p-type InGaP layer 5, n-type GaAs current block layer 6, and p-type GaAs cap layer 7. A p side electrod 11 made of AuZn/Au alloy is formed on the surface of the p-type GaAs cap layer 7. This device is formed to have a double hetero structure in order to enhance light emission. When current flows upon the application of voltage across the p and n side electrodes 11 and 10, a laser beam is radiated from a pair of side faces A which are crystal cleavage faces.

The semiconductor laser device constructed as above is fixedly mounted on a stem 13 made of copper (Cu) with gold (Au) being plated. The surface of the p side electrode 11 is fixedly attached to the stem 13 using a soldering agent 12 made of a low melting point metal such as indium (In), and a lead (Pb)-tin (Sn) alloy.

A conventional semiconductor device however has the problem that soldering agent 12 creeps up a pair of side faces B perpendicular to the crystal cleavage faces A, resulting in a short-circuited device. FIG. 7 illustrates this creep-up phenomenon of soldering agent 12. The conductive soldering agent 12 bonding together the stem 13 and the p side electrode 11 creeps up to the p-type InGaAlP clad layer 4, short-circuiting the clad layer 4 to the p side electrode 11.

For semiconductor laser devices in particular, a red semiconductor laser device using InGaAlP of large specific heat, faults of semiconductor laser devices caused by short-circuits have occurred heretofore many times, lowering manufacturing yield

SUMMARY OF THE INVENTION

It is therefore an object of the present invention to provide a semiconductor laser device and a method of manufacturing the same, capable of preventing short-circuiting of an electrode and a clad layer, thereby improving the manufacturing yield.

The present invention provides a semiconductor laser device having: a substrate of a first conductivity type; a first clad layer of the first conductivity type formed on the substrate; an active layer formed on the first clad, the active layer being of either one of the first conductivity type and a second conductivity type opposite to the first conductivity type; a second clad layer of the second conductivity type formed on the active layer; a current block layer of the first conductivity type formed on the second clad layer; and an ohmic layer of the second conductivity type formed on the current block layer, wherein the end portion of the ohmic layer covers the side face of the second clad layer to at least some depth, at a pair of side faces of the semiconductor laser device of a double hetero type having a crystal cleavage face at least at a pair of faces substantially perpendicular to the faces of the substrate.

For the operation of a semiconductor laser device, it is fixedly mounted on a stem using soldering agent. According to the present invention, the end portions of the ohmic layer cover the side face of the second clad layer to at least some depth. Therefore, even if the soldering agent creeps up along the side face, it will not attach itself to the second clad layer, thereby preventing a short-circuit.

Such a semiconductor laser can be manufactured by a method of manufacturing a semiconductor laser device according to the present invention. The method includes the steps of: sequentially forming, on a substrate of a first conductivity type, a first clad layer of the first conductivity type, an active layer of one of the first conductivity type and a second conductivity type opposite to the first conductivity type, a second clad layer of the second conductivity type, and a current block layer of the first conductivity type; forming a current converging trench in the current block layer, and forming device isolation trenches extending from the current block layer to the second clad layer at least to some depth; and forming an ohmic layer of the second conductivity type on the current block layer, wherein upon cleavage along the device isolation trenches, the end portion of the ohmic layer covers the side face of the second clad layer at least to some depth, at a pair of side faces substantially perpendicular to the faces of the substrate.

With a semiconductor laser device manufactured by the method of this invention, upon cleavage along the device isolation trenches, the end portion of the ohmic layer covers the side face of the second clad layer at least to some depth. Therefore, even if the soldering agent creeps up along the side face, it will not attach itself to the second clad layer. Short circuits are therefore prevented.

DESCRIPTION OF THE PREFERRED EMBODIMENTS

Figure 1:
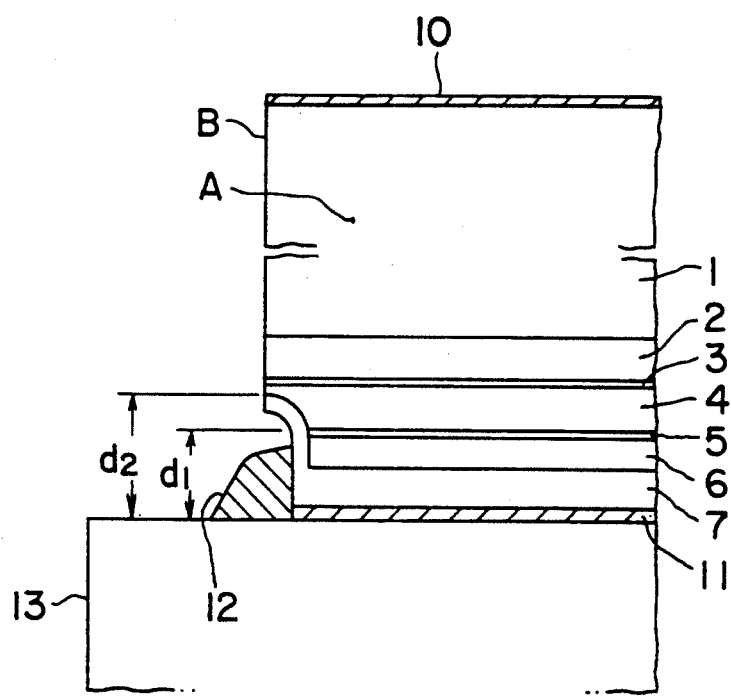
FIG. 1 is a cross sectional view in elevation showing the structure of a semiconductor laser device according to an embodiment of the present invention.
Figure 5:
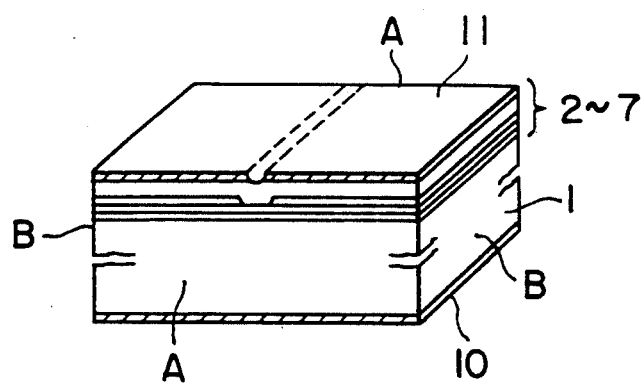
FIG. 5 is a perspective view showing a conventional semiconductor laser device.
Figure 6:
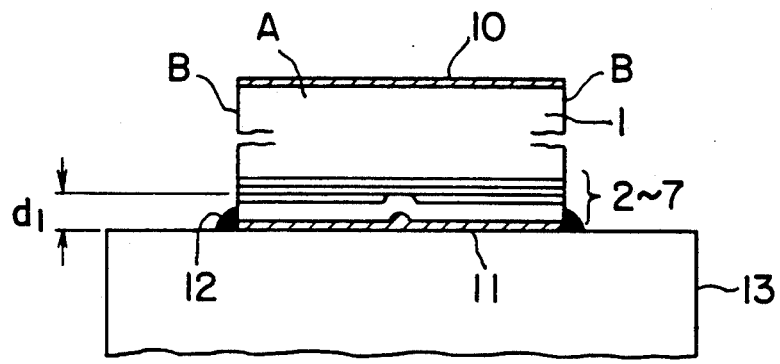
FIG. 6 is a cross sectional view in elevation showing a semiconductor laser device fixedly mounted on a stem.
Figure 7:
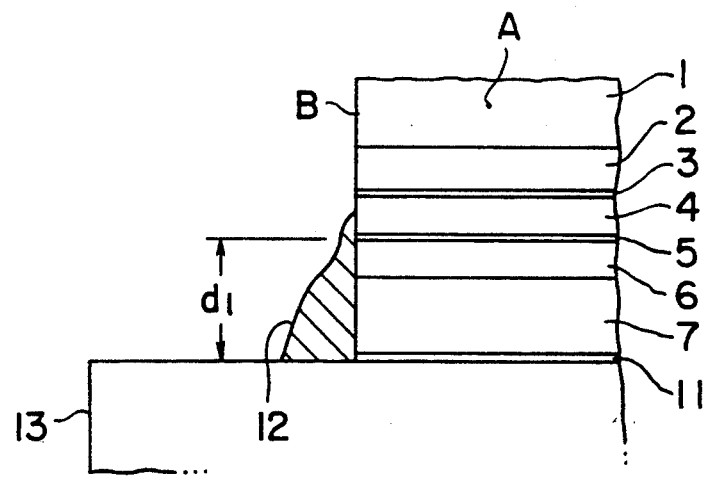
FIG. 7 is an enlarged partial view of FIG. 6 showing a creep-up phenomenon of soldering agent.

Embodiments of the present invention will be described with reference to the accompanying drawings. FIG. 1 shows a semiconductor laser fixedly mounted on a stem 13, according to an embodiment of the present invention. Layers constituting the semiconductor laser device are the same as those of the conventional device shown in FIG. 5. Specifically, between a n side electrode 10 and a p side electrode 11, there are formed sequentially and in order an n-type GaAs substrate 1, n-type InGaAlP clad layer 2, InGaP active layer 3, p-type InGaAlP clad layer 4, p-type InGaP layer 5, n-type GaAs current block layer 6, and p-type GaAs cap layer 7.

This device differs from a conventional device in that the p-type GaAs cap layer 7 covers the n-type GaAs current block layer 6, p-type InGaP layer 5, and p-type InGaAlP clad layer 4, respectively on the side of a pair of side faces B perpendicular to crystal cleavage surfaces A. As shown in FIG. 1, the opposite end portions of the p-type GaAs cap layer 7 cover the area extending upright by a distance d2 from the surface of the positive side electrode 11 to the intermediate point of the p-type InGaAlP clad layer 4. This distance d2 is longer than a distance d1 from the surface of the p side electrode 11 to the junction between the p-type InGaAlP clad layer 4 and the p-type InGaP layer 5.

Even if soldering agent 12 bonding together the p side electrode 11 and the stem 13 creeps up, a short-circuit will not be generated between the p-type InGaAlP clad layer 4 and the p side electrode 11, thereby improving the manufacturing yield. Particularly in the case of this embodiment, not only does the p-type GaAs cap layer 7 cover up to the p-type InGaAlP clad layer 4 on the side of a pair of side faces B, but it also has a concave shape. Therefore, the creep-up phenomenon of the soldering agent 12 itself can be suppressed, reliably preventing the attachment of the soldering agent 12 up to the p-type InGaAlP clad layer 4.

Figure 2A:
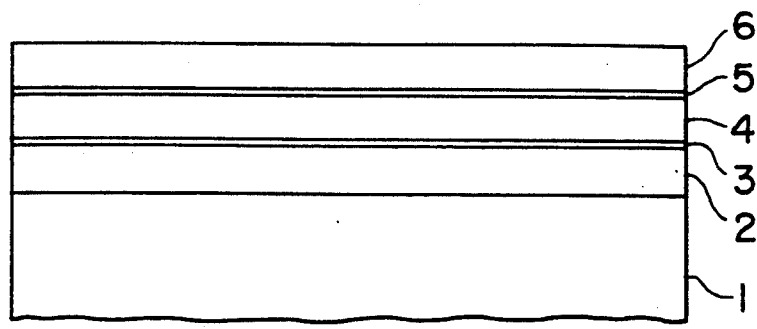
FIGS. 2(a) to 2(c) are cross section view in elevation showing the steps of manufacturing a semiconductor laser device according to an embodiment of the present invention.
Figure 2B:
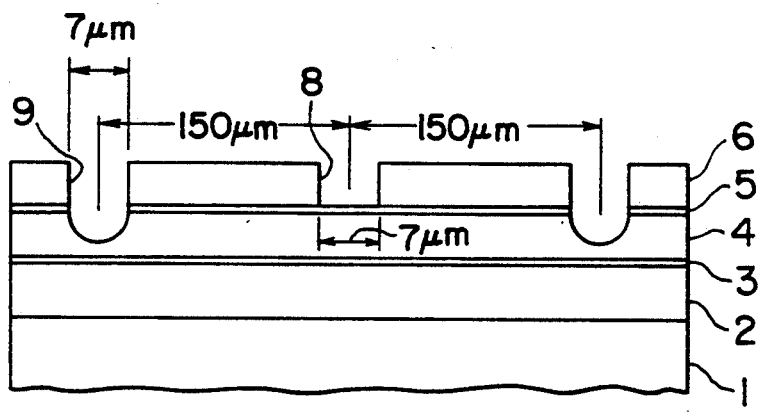
Figure 2C:
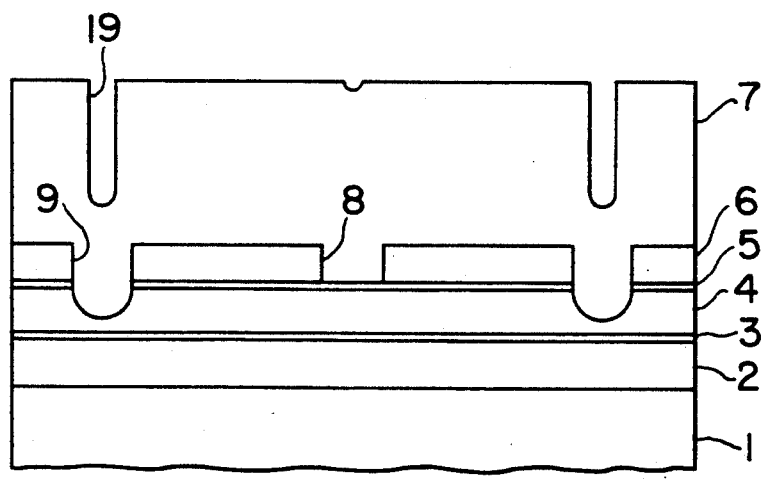

Next, there will be described a method of manufacturing a semiconductor laser device having such a cross sectional structure, according to an embodiment of the present invention. FIGS. 2A to 2C are cross sectional views of a semiconductor laser device at different manufacturing stages.

As shown in FIG. 2(a), on the crystal face (001) of a silicon (Si) doped GaAs substrate 1, there is formed an n-type $In_{0.5}(Ga_{0.3}Al_{0.7})P$ clad layer 2 of 0.8 $\mu$m thickness by means of a decompressed MoCVD method, the layer 2 having been doped with Si at a concentration of $4 \times 10^{17}$ cm$^{-3}$. On the surface of the clad layer 2, there is formed an InGaP active layer 3 of 600 angstroms by means of the decompressed MoCVD method, the layer 3 not being doped. On the surface of the InGaP active layer 3, there is formed a p-type $In_{0.5}(Ga_{0.3}Al_{0.7})_{0.5}P$ layer 4 of 0.8 $\mu$m thickness with zinc (Zn) having been doped at a concentration of $3 \times 10^{17}$ cm$^{-3}$. On the surface of the layer 4, there is formed a p-type InGaP layer 5 of 600 angstroms with Zn having been doped at a concentration of $3 \times 10^{17}$ cm$^{-3}$. On the surface of the layer 5, there is formed an n-type GaAs current block layer 6 with Si having been doped at a concentration of $5 \times 10^{18}$ cm$^{-3}$.

Next, a resist film is coated over the surface of the n-type GaAs current block 6 by means of a photoetching method. The resist film is then subjected to exposure and development processes to form stripe trenches. These trenches extend in the direction of the crystal face (110) of the n-type GaAs current block layer 6. The trenches are 7 $\mu$m wide and are formed at an interval of 150 $\mu$m.

Using this resist film as a mask, only the n-type GaAs current block layer 6 is etched with sulfuric-acid-based etchant, to thereby form trenches which are 7 $\mu$m wide and which are formed at an interval of 150 $\mu$m. These trenches correspond to device isolation trenches 9 specific to the present embodiment and current converging trenches 8 existing also in a conventional device. The resist film is thereafter removed.

A resist film is formed on the surface of the n-type GaAs current block layer 6 by means of the photoetching method. The resist film is subjected to exposure and development processes to form stripe trenches. The trenches are formed only at positions where the device isolation trenches 9, the trenches being 7 $\mu$m wide and being formed at an interval of 300 $\mu$m. Using this resist film as a mask, oxalic-acid-based etchant is used to etch the p-type InGaAlP clad layer 4 to the depth of 0.6 $\mu$m. The resist film is thereafter removed.

In this manner, there are formed the device isolation trenches 9 of 7 $\mu$m wide at an interval of 300 $\mu$m, while etching the n-type GaAs current block layer 6, p-type InGaP layer 5, and p-type GaAlP clad layer 4 to some depth (FIG. 2(b)).

Thereafter, on the surface of the n-type GaAs current block 6, there is formed a p-type GaAs cap layer 7 of 3 $\mu$m thickness by means of the decompressed MoCVD method, the cap layer 7 having been doped with Zn at a concentration of $1 \times 10^{19}$ cm$^{-3}$. In this case, the presence of the device isolation trenches 9 in the n-type GaAs current block layer 6 causes device isolation trenches 19 to be formed in the deposited p-type GaAs cap layer 7 (FIG. 2(c)).

Next, in order to ensure cleavage of the n-type GaAs substrate 1 when the semiconductor wafer is divided into chips, a lapping process is carried out on the surface of the n-type GaAs substrate down to the depth of 80 $\mu$m. A n side electrode 10 made of AuGe/Au alloy is formed on the surface of the n-type GaAs substrate 1, and a p side electrode 11 made of Au/AuZn/Au alloy is respectively formed on the surface of the p-type GaAs cap layer, 7, by means of a resistive heating evaporation method. The electrodes are then subject to a thermal treatment.

Figure 3:
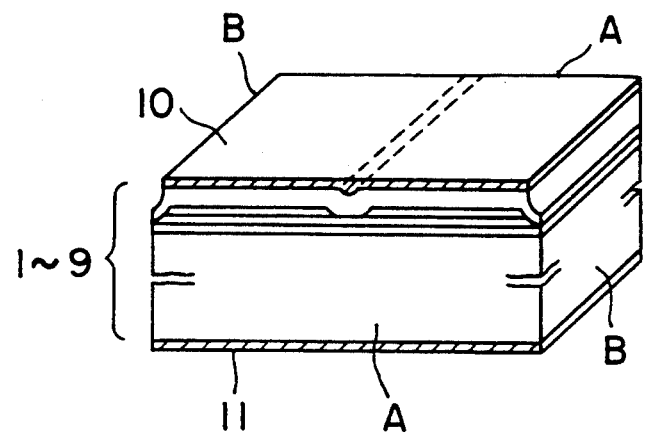
FIG. 3 is a perspective view showing a semiconductor laser device.

The wafer is divided into chips each having a size of $300 \times 300$ $\mu$m as shown in FIG. 3. A pair of side faces A is crystal cleavage faces, and a pair of side faces perpendicular to the faces A is represented by B.

Figure 4:
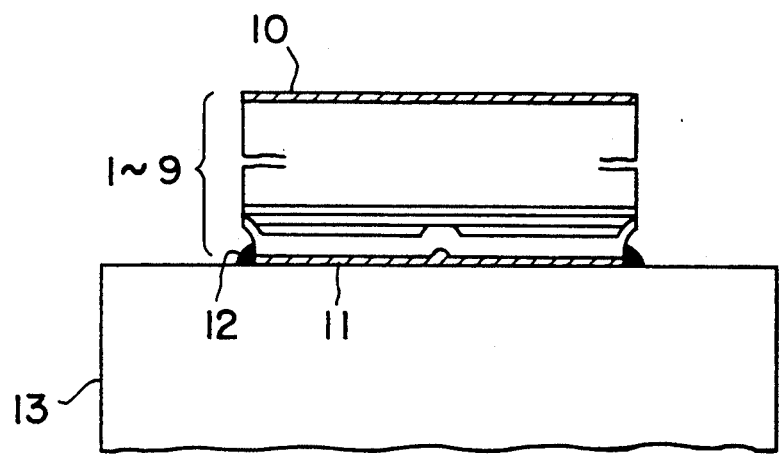
FIG. 4 is a cross sectional view in elevation showing a semiconductor laser device fixedly mounted on a stem.

On the surface of the exposed device isolation trenches 19 of the p-type GaAs cap layer 7 of each divided chip, there is coated an aluminum oxide ($Al_2O_3$) of about 335 nm thickness. The chip is fixedly mounted on a stem 13 at its n side electrode 11 using soldering agent 12, as shown in FIG. 4. A partially enlarged view of the area near the soldering agent 12 shown in FIG. 4 corresponds to FIG. 1.

In each chip divided along the device isolation trenches 19 manufactured according to this embodiment, as shown in FIG. 1, not only does the p-type GaAs cap layer 7 cover the n-type GaAs current block layer 6, p-type InGaP layer 5, and p-type InGaAlP clad layer 4 to some depth, but it also has a concave shape. Therefore, the creep-up of the soldering agent 12 can be suppressed, reliably preventing attachment of the soldering agent 12 to the p-type InGaAlP clad layer 4 and short-circuiting of the clad layer 4 and the p side electrode 11.

The characteristics of a semiconductor laser device manufactured according to the above-described method were measured. The desired characteristics were obtained in that an oscillation threshold current Ith was 70 mA, operation voltage VF was 2.3 V at CW, and oscillation wavelength Wp was 675 nm.

No defect was found on this device, such as a short-circuit between the p side electrode 11 and the p-type InGaAlP clad layer. In the case of a conventional device, if soldering agent creeps up from the surface of the p side electrode 11 higher than 3 μm, it is inevitable that the soldering agent contacts the p-type InGaAlP clad layer 4.

On the contrary, according to the device of the present embodiment shown in FIG. 1, even if soldering agent 12 creeps up from the surface of the p side electrode 11 to the height of 3 μm or more, it is possible to prevent attachment of the soldering agent with the p-type InGaAlP clad layer 4. The short-circuit defect percentage of conventional devices are about 7%. It was confirmed that no short-circuit defect was found from devices manufactured by the present method, thereby greatly improving manufacturing yield.

An evaluation test for long-term reliability was performed for semiconductor laser devices of the present method. There was no problem for lap data after 1000 hours. The estimated life calculated from the deterioration factor at that time showed a sufficient result of 10000 hours or more. Also during this test, there was found no reliability deterioration, such as shortcircuit defect, peeling-off of electrode, and insufficient stem bonding strength.

In operation of a semiconductor laser device, current will flow from the p side electrode 11 to to the n side electrode 10 via the path of the p-type GaAs cap layer 7, current converging trench 8 of the n-type GaAs current block layer 6, p-type InGaAlP clad layer 4, InGaP active layer 3, and n-type GaAs substrate 1. A glance at the structure of the embodiment device shown in FIG. 1 shows that there is current leakage from the p-type GaAs cap layer 7 to the p-type InGaAlP clad layer 4.

However, since the p-type InGaP layer 5 is not interposed between the p-type GaAs cap layer 7 and the p-type InGaAlP clad layer 4, a high hetero barrier is present therebetween so that leakage current will not be generated and there is no problem of adverse effects to the device characteristics.

The above-described embodiments are only for the purpose of illustration, and the invention is not limited thereto. For example, in the embodiment device, the device isolation trenches 19 are formed in the p-type GaAs cap layer 7, to divide a wafer into discrete chips each of which has the p-type GaAs cap layer 7 covering up to the p-type InGaAlP clad layer 7. However, the device isolation trenches are not necessarily required so long as the p-type GaAs cap layer covers up to the p-type InGaAlP clad layer at the side face pair perpendicular to the crystal cleavage faces.

Furthermore, although the laser device of the present embodiment has one pair of crystal cleavage faces, there is a device having crystal cleavage faces at both pairs of side faces. In this case, it is sufficient if the end portion of the ohmic layer covers the second clad layer at least to some depth, at one of the two pairs of side faces.

What is claimed is:

1. A semiconductor laser device comprising:
   a first electrode;
   a substrate of a first conductivity type formed on said first electrode;
   a first clad layer of said first conductivity type formed on said substrate;
   an active layer formed on said first clad layer, said active layer being of either one of said first conductivity type and a second conductivity type, wherein said second conductivity type is opposite to said first conductivity type;
   a second clad layer of said second conductivity type formed on said active layer;
   a current block layer of said first conductivity type formed on said second clad layer;
   an ohmic layer of said second conductivity type formed on said current block layer;
   a second electrode formed on said ohmic layer; and
   a stem on which said second electrode is mounted with a soldering agent,
   wherein a pair of side faces of each of said ohmic layer, said current block layer and said second clad layer have a concave shape, and end portions of said ohmic layer cover the pair of side faces of said second clad layer respectively, thereby preventing the soldering agent from creeping up and from attaching to said second clad layer.

2. A semiconductor laser device according to claim 1, wherein said first electrode is formed on a surface of said substrate of said first conductivity type, and said second electrode is formed on a surface of said ohmic layer of said second conductivity type, wherein said ohmic layer of said second conductivity type is fixedly mounted on said stem with soldering agent with said second electrode being interposed therebetween.

* * * * *